(12) United States Patent
Sasaki et al.

(10) Patent No.: US 7,288,313 B2
(45) Date of Patent: Oct. 30, 2007

(54) LAMINATED BODY

(75) Inventors: Noboru Sasaki, Tokyo (JP); Shinichiro Tanizaki, Tokyo (JP); Masayuki Ohashi, Tokyo (JP); Hiroshi Suzuki, Tokyo (JP); Masanobu Yoshinaga, Tokyo (JP); Tsunenori Komori, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 16 days.

(21) Appl. No.: 10/473,950

(22) PCT Filed: Apr. 3, 2002

(86) PCT No.: PCT/JP02/03339

§ 371 (c)(1),
(2), (4) Date: Oct. 3, 2003

(87) PCT Pub. No.: WO02/083408

PCT Pub. Date: Oct. 24, 2002

(65) Prior Publication Data

US 2004/0115445 A1    Jun. 17, 2004

(30) Foreign Application Priority Data

Apr. 9, 2001    (JP) .............................. 2001-109502

(51) Int. Cl.
*B32B 7/02* (2006.01)

(52) U.S. Cl. ...................... 428/216; 428/213; 428/215; 428/336; 428/424.2; 428/424.4; 428/425.5; 428/451

(58) Field of Classification Search ................ 428/213, 428/336, 425.2, 451, 215, 216, 424.2, 424.4, 428/425.5
See application file for complete search history.

(56) References Cited

U.S. PATENT DOCUMENTS

| 3,442,686 A | 5/1969 | Jones |
| 4,937,139 A | 6/1990 | Genske et al. ............... 428/349 |
| 4,950,512 A | 8/1990 | Akao .......................... 428/35.8 |
| 5,112,673 A | 5/1992 | Sawada et al. |
| 5,153,074 A | 10/1992 | Migliorini .................... 428/463 |
| 5,370,937 A * | 12/1994 | Lee et al. .................... 428/448 |

FOREIGN PATENT DOCUMENTS

| EP | 1 132 197 A2 | 9/2001 |
| EP | 1 132 197 A3 | 9/2001 |
| JP | 62-156942 | 7/1987 |
| JP | 63-28017 | 6/1988 |
| JP | 2-258251 | 10/1990 |
| JP | 5-65644 | 3/1993 |
| JP | 6-234186 | 8/1994 |
| JP | 8-318591 | 12/1996 |
| JP | 10-507705 | 7/1998 |
| JP | 11-147276 | 6/1999 |
| JP | 2000-127300 | 5/2000 |
| JP | 2000-185366 | 7/2000 |
| JP | 2000-238172 | 9/2000 |

OTHER PUBLICATIONS

English Translation of International Preliminary Examination Report (Form PCT/IPEA/409).
Japanese Patent Office Action, dated Mar. 20, 2007.

* cited by examiner

*Primary Examiner*—D. S. Nakarani

(57) ABSTRACT

A laminated material having, on a substrate, a structure in which a gas-barrier intermediate layer formed by coating with a coating agent containing a water-soluble polymer is interposed between two thin deposition layers.

31 Claims, 3 Drawing Sheets

LAMINATED BODY

CROSS-REFERENCE TO RELATED APPLICATIONS

This application is a U.S. national phase application under 35 USC 371 of International Application PCT/JPO2/03339 (not published in English) filed Apr. 3, 2002.

TECHNICAL FIELD

The present invention relates to a laminated material having gas barrier properties and, more particularly, to a laminated material to be used as packaging materials for food, non-food products, medicines, and the like and as members of electronic apparatuses.

BACKGROUND ART

A film to be used as packaging materials for food, non-food products, medicines, and the like and as members of electronic apparatuses is required to have gas barrier properties which prevent oxygen, water vapor, and some other gases which deteriorate the contents from passing through the film, in order to suppress deterioration of the contents and maintain the functions and properties of the contents. As films having ordinary gas barrier levels, a vinylidene chloride resin film having relatively good gas barrier properties as a polymer and a laminated film coated with this vinylidene chloride resin film are often used. However, these films are unsatisfactory when high gas barrier levels are required. Therefore, it is necessary to use a laminated film containing a metal foil made of a metal such as aluminum.

This laminated film containing a metal foil or the like has high-level gas barrier properties regardless of temperature and humidity. However, this laminated film has many problems, e.g., the film must be discarded as an incombustible material after used, the weight per unit area of the film is large, and the contents cannot be inspected by a metal detector.

As packaging materials which have solved these problems, U.S. Pat. No. 3,442,686, Jpn. Pat. Appln. KOKOKU Publication No. 63-28017, and the like disclose deposited films which metal oxides, e.g., inorganic oxides such as silicon oxide, aluminum oxide, and magnesium oxide are deposited on plastic films by using depositing method such as vacuum deposition method and sputtering method. These deposited films are regarded as suitable for packaging materials which have transparency unobtainable by metal foils, which have gas barrier properties against gases such as oxygen and water vapor, and which are light in weight and readily disposable.

Such deposited films are not singly used as packaging materials in most cases. For example, a deposited film is processed into a packaging material through various steps of, e.g., printing characters and patterns on the surface of the deposited film, bonding the deposited film on another film, and processing the deposited film into a packaging material such as a vessel.

The abovementioned deposited films were bonded on a sealant film and the barrier properties such as the oxygen permeability and the water vapor permeability were measured. As a consequence, the gas barrier properties were equal or superior to those of polymeric gas-barrier films, but did not reach the gas barrier properties of metal foils.

As described above, the conventional deposited films are light in weight and readily disposable, realize high transparency, and allow inspection of contents by a metal detector. However, no such high-level gas barrier properties as those of metal foils cannot be obtained.

DISCLOSURE OF INVENTION

It is an object of the present invention to provide a highly practical laminated material having high-level gas barrier properties equivalent to those of metal foils, without using any metal foils.

A laminated material of the present invention is characterized by comprising a substrate made of a plastic material, a first thin deposition layer formed on the substrate, a gas-barrier intermediate layer formed on the first thin deposition layer by coating with a coating agent containing at least a water-soluble polymer, and a second thin deposition layer formed on the intermediate layer.

BEST MODE FOR CARRYING OUT OF THE INVENTION

A laminated material of the present invention comprises a substrate made of a plastic material, a first thin deposition layer formed on the substrate, a gas-barrier intermediate layer formed on the first thin deposition layer by coating with a coating agent containing at least a water-soluble polymer, and a second thin deposition layer formed on the intermediate layer.

The present invention can provide a highly practical laminated material having superior gas barrier properties equivalent to those of metal foils, without using any metal foils.

Figure 1:
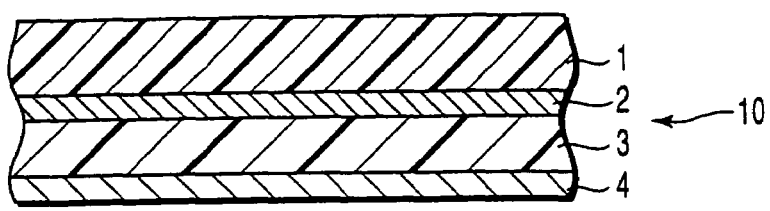
FIG. 1 is a sectional view showing the first example of a laminated material of the present invention.

FIG. 1 is a sectional view showing the first example of the laminated material according to the present invention. This laminated material 10 has a structure in which a first thin deposition layer 2, a gas-barrier intermediate layer 3, and a second thin deposition layer 4 are laminated in this order on a plastic substrate 1.

Such excellent gas barrier properties cannot be achieved by any of a structure in which a single thin deposited film is formed on a substrate, a structure in which two such thin deposition layers are formed on a substrate, and a structure in which a gas-barrier resin layer similar to a gas-barrier intermediate layer is formed on these two thin deposition layers formed on a substrate. The present inventors conducted extensive research and have found that it is important to form a structure in which a gas-barrier intermediate layer 3 is sandwiched between first and second thin deposition layers 2 and 4 on a substrate 1. This significantly lowers the oxygen permeability and the water vapor permeability. Consequently, a conventionally unobtainable, highly practical laminated material having gas barrier properties equivalent to those of metal foils is obtained.

The gas barrier properties of the laminated material of the present invention can be represented by, e.g., the water vapor permeability and the oxygen permeability.

The laminated material of the present invention preferably has a water vapor permeability of 0.2 (g/m$^2$·day) or less, when, e.g., measurement is performed at a temperature of 40° C. and a humidity of 90% by using the Mokon method. Within this range, gas barrier properties equivalent to those of metal foils are obtained. The water vapor permeability is more preferably 0.01 (g/m$^2$·day) to 0.1 (g/m$^2$·day).

The oxygen permeability is preferably 0.2 or less (cm$^3$/m$^2$·day·atm) at, e.g., a temperature of 30° C. and a humidity of 70%. Within this range, gas barrier properties equivalent to those of metal foils are obtained. The oxygen permeability is particularly preferably 0.01 to 0.1 (cm$^3$/m$^2$·day·atm).

As the plastic substrate, a single film and various laminated films can be used by taking into account the suitability as a packaging material or of a member of an electronic apparatus. As the main material of the plastic substrate, it is possible to use, e.g., polyester films such as polyethyleneterephthalate (PET) and polyethylenenaphthalate (PEN), polyolefin films such as polyethylene and polypropyrene, a polystyrene film, a polyamide film, a polycarbonate film, a polyacrylonitrile film, and a polyimide film.

When transparency is necessary, a transparent film substrate is preferred.

The plastic substrate can be either stretched or unstretched provided that it has mechanical strength and dimensional stability.

The plastic material is usually processed into a film. In particular, a polyethyleneterephthalate film or polyamide film arbitrarily stretched in two axial directions is preferably used from the viewpoint of heat resistance.

To improve adhesion to the thin deposition layer, it is also possible to perform a pre-treatment on the surface of the plastic substrate. Examples are a corona treatment, low-temperature plasma treatment, ion bombarding treatment, chemical treatment, and solvent treatment.

Additionally, various known additives and stabilizers such as an antistatic agent, ultraviolet inhibitor, plasticizer, and lubricant can be used on the surface of this substrate away from the surface on which the thin deposition layers are formed.

When the processability during the formation of the first and second thin deposition layers and the gas-barrier intermediate layer is taken into consideration, the practical thickness of the plastic substrate is preferably 3 to 200 µm, and more preferably, 6 to 30 µm.

When mass-productivity is taken into consideration, a long band-like continuous film is desirable so that the individual layers can be continuously formed.

The first and second thin deposition layers are obtained by depositing a material having barrier properties against oxygen, water vapor, and the like. As this material, it is possible to use at least one type of material selected from metals such as aluminum, copper, and silver or metal oxides such as yttrium tantalum oxide, aluminum oxide, silicon oxide, and magnesium oxide.

The first and second thin deposition layers can be made of the same material or different materials.

Figure 2:
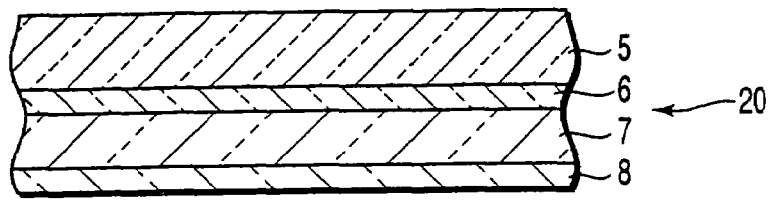
FIG. 2 is a sectional view showing the second example of the structure of the laminated material of the present invention.
Figure 3:
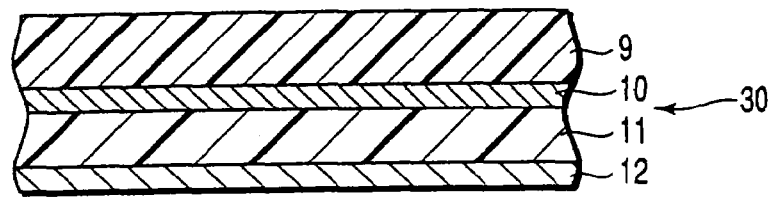
FIG. 3 is a sectional view showing the third example of the structure of the laminated material of the present invention.

FIGS. 2 and 3 are sectional views showing the second and third examples of the structure of the laminated material according to the present invention.

When high transparency is required, the use of an inorganic oxide is preferred.

As shown in FIG. 2, a transparent laminated material 20 has a structure in which a first thin transparent deposition layer 6 substantially made of an inorganic oxide, a transparent gas-barrier intermediate layer 7, and a second thin transparent deposition layer 8 substantially made of an inorganic oxide are laminated in this order on a transparent substrate 5.

When high transparency is necessary, at least one type of inorganic oxide selected from yttrium tantalum oxide, aluminum oxide, silicon oxide, and magnesium oxide can be used in the first and second thin deposition layers.

When shielding properties are necessary, a metal can be used in at least one of the first and second thin deposition layers.

As shown in FIG. 3, a laminated material 30 having shielding properties has a structure in which a first thin deposition layer 10 substantially made of a metal, a gas-barrier intermediate layer 11, and a second thin deposition layer 12 substantially made of a metal are laminated in this order on a substrate 9.

As the metal, it is possible to use at least one type of a metal selected from aluminum, copper, and silver.

When a metal is used as the thin deposition layer, an antistatic effect resulting from the conductivity of the metal can also be expected.

When aluminum is used as the metal, electromagnetic wave shielding properties can be obtained.

When high oxygen permeability and water vapor permeability are required, aluminum, aluminum oxide, silicon oxide, and magnesium oxide are preferably used in at least one of the first and second thin deposition layers.

The thickness of the first and second thin deposition layers is preferably 5 to 300 nm, although it depends upon the types of metal and oxide used and upon the composition of the thin deposition layers. If the film thickness of the thin deposition layers is less than 5 nm, no uniform films can be obtained, resulting in unsatisfactory gas barrier properties. If the film thickness exceeds 300 nm, no satisfactory flexibility can be held, so cracks are often formed by external factors such as bending and pulling. The thickness of the first and second thin deposition layers is more preferably 10 to 150 nm.

Most preferably, the thickness of the first thin deposition layer is 10 to 40 nm, and the thickness of the second thin deposition layer is 10 to 40 nm.

Even when a metal is used, translucency can be obtained if the thickness of the metal is 5 to 30 nm, although this depends upon the type of the metal. High translucency can be obtained when the thickness of the metal is 5 to 15 nm.

For example, when a 5- to 30-nm thick aluminum layer is formed as at least one of the first and second thin deposition layers, not only translucency but also electromagnetic wave shielding properties, an antistat effect, and gas barrier properties can be obtained. The thickness of this aluminum layer is more preferably 5 to 15 nm, since the translucency further increases.

Figure 4:
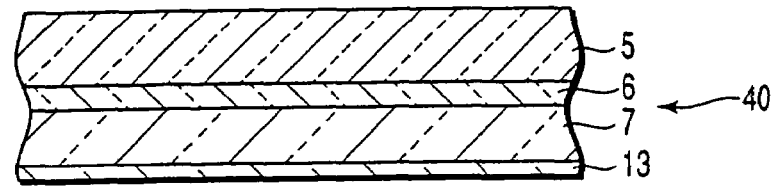
FIG. 4 is a sectional view showing the fourth example of the structure of the laminated material of the present invention.

FIG. 4 is a sectional view showing the fourth example of the structure of the laminated material according to the present invention.

As shown in FIG. 4, this laminated material 40 has the same structure as in FIG. 2 except that a translucent second thin deposition layer having a film thickness of 5 to 30 nm and substantially made of a metal such as aluminum is formed as the second deposition layer instead of the second thin transparent deposition layer 8. Note that this thin translucent aluminum deposition layer can be formed as at least one of the first and second thin deposition layers.

A conventional vacuum deposition method can be used as a method of forming this thin deposition layer. It is also possible to use, e.g., sputtering, ion plating, or plasma chemical vapor deposition (plasma CVD). When the productivity is taken into consideration, the vacuum deposition method is preferred. As a heating means of this vacuum deposition method, one of electron beam heating, resistance heating, and induction heating is preferred.

To improve the adhesion between the thin deposition layer and the substrate and the denseness of the thin deposition layer, deposition can be performed by using a plasma assisting method or an ion beam assisting method. To improve the transparency, reactive deposition by which oxygen gas or the like is blown during deposition can be performed.

The gas-barrier intermediate layer sandwiched between the first and second thin deposition layers is formed by coating with a coating agent containing at least a water-soluble polymer component.

Examples of the water-soluble polymer are polyvinyl alcohol, polyvinyl pyrrolidone, starch, methyl cellulose, carboxymethyl cellulose, and sodium alginate.

Polyvinyl alcohol (to be abbreviated as PVA hereinafter) is particularly preferred because the gas barrier properties improve. PVA herein mentioned is generally obtained by saponifying polyvinyl acetate. PVA is not particularly limited and includes so-called partially saponified PVA in which several tens of % of an acetic acid group remain and complete PVA in which only a few % of an acetic acid remain. The gas-barrier intermediate layer can be formed by coating the first thin deposition layer with a coating agent containing a water-soluble polymer component, and heating and drying this coating agent.

More preferably, the coating agent contains primarily at least one of i) one or more types of metal alkoxides and their hydrolyzed products and ii) tin chloride, and water or a water-alcohol solution mixture. That is, a solution in which a water-soluble polymer or tin chloride is dissolved in water or in a water-alcohol solution mixture, or a solution in which a water-soluble polymer and a metal alkoxide are dissolved, either directly or pre-hydrolyzed, in water or in a water-alcohol solution mixture, can be prepared as the coating agent.

Tin chloride preferably used in the coating agent is stannous chloride ($SnCl_2$), stannic chloride ($SnCl_4$), or a mixture thereof. In addition, anhydrides and hydrates of these tin chlorides are suitably usable.

Furthermore, the metal alkoxide is a compound represented by the formula $M(OR)_n$ wherein M is one member selected from metals such as Si, Ti, Al, and Zr, and R is one member selected from alkyl groups such as $CH_3$ and $-C_2H_5$. Practical examples are tetraethoxysilane $Si(OC_3H_6)_4$ and triisopropoxy aluminum $Al(O-2'-C_3H_7)_3$. Of these compounds, tetraethoxysilane and triisopropoxy aluminum are preferred because they are relatively stable in an aqueous solvent after being hydrolyzed.

It is possible, where necessary, to add to the coating agent known additives such as an isocyanate compound, silane coupling agent, dispersant, stabilizer, viscosity modifier, and colorant, as long as the gas barrier properties do not deteriorate.

An isocyanate compound to be added to the coating agent preferably has two or more isocyanate groups contained in each molecule. Examples of this isocyanate compound are monomers such as tolyleneisocyanate, triphenylmethanetriisocyanate, and trimethylxylenediisocyanate, and polymers and derivatives of these monomers.

As a method of coating the coating agent, it is possible to use a conventionally known coating means such as dipping, roll coating, screen printing, spraying, and gravure printing.

The dried thickness of the gas-barrier intermediate layer is preferably 200 to 600 nm.

Assuming the thickness of the gas-barrier intermediate layer is 1, the ratio of the thickness of the thin deposition layers (layers A and C) to the thickness of the gas-barrier intermediate layer is preferably 0.005 to 0.25.

If this thickness ratio of the thin deposition layers is lower than 0.005 or the dried thickness of the gas-barrier intermediate layer is less than 200 nm, no uniform coating film is obtained, and the gas barrier properties are often unsatisfactory. If the thickness ratio exceeds 0.25 or the dried thickness exceeds 600 nm, cracks are often produced because the flexibility is unsatisfactory.

In the laminated material of the present invention, a primer layer can also be formed between the plastic substrate and the first thin deposition layer.

Figure 5:
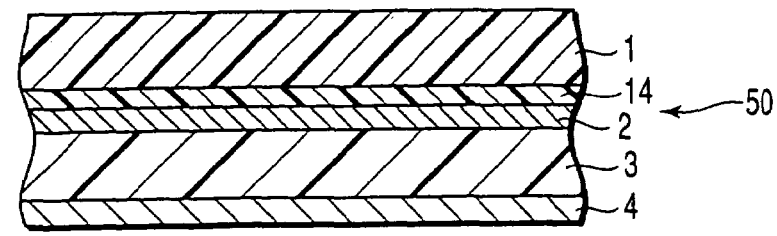
FIG. 5 is a sectional view showing the fifth example of the structure of the laminated material of the present invention.

FIG. 5 is a sectional view showing the fifth example of the structure of the laminated material according to the present invention.

As shown in FIG. 5, this laminated material 50 has the same structure as in FIG. 1 except that a primer layer 14 is formed between a substrate 1 and a first thin deposition layer 2.

When this primer layer 14 is formed, the adhesion between the substrate 1 and the first thin deposition layer 2 can be increased. This can prevent peeling of the thin deposition layer after boiling sterilization or retort sterilization.

A material suitable as the primer layer is a composition comprising of, e.g., polyesterpolyol or acrylpolyol, an isocyanate compound, and a silane coupling agent.

This composition for the primer layer will be described in more detail below.

Acrylpolyol used in the present invention is a polymeric compound which is obtained by polymerizing an acrylic acid derivative monomer or by copolymerizing an acrylic acid derivative monomer and another monomer, and which has a hydroxyl group at the end. This acrylpolyol is allowed to react with an isocyanate group of an isocyanate compound to be added later. It is particularly preferable to use acrylpolyol obtained by singly polymerizing an acrylic acid derivative monomer such as ethylmethacrylate, hydroxyethylmethacrylate, hydroxypropylmethacrylate, or hydroxybutylmethacrylate, or by copolymerizing any of these monomers and another monomer such as styrene. When the reactivity to an isocyanate compound is taken into consideration, the hydroxyl value is preferably 5 to 200 (KOH mg/g).

Polyesterpolyol preferably used in the present invention is a polyester-based resin which is obtained from an acid material and an alcohol material by a known manufacturing method, and which has two or more hydroxyl groups at the end to be react with isocyanate groups of isocyanate compounds which are added late. Examples of the acid material are terephthalic acid, isophthalic acid, phthalic acid, methylphthalic acid, trimellitic acid, pyromellitic acid, adipic acid, sebacic acid, succinic acid, maleic acid, fumaric acid, tetrahydrophthalic acid, methyltetrahydrophthalic acid, hexahydrophthalic acid, and reactive derivatives of these acids. Examples of the alcohol material are ethyleneglycol, propyleneglycol, 1,3-butanediol, 1,4-hexanediol, diethyleneglycol, dipropyleneglycol, 1,4-cyclohexanedimethanol, neopentylglycol, bishydroxyethylterephthalate, trimethylolmethane, trimethylolpropane, glycerin, and pentaerythritol. This polyesterpolyol is allowed to react with an isocyanate group of an isocyanate compound to be added later.

The isocyanate compound used in the present invention is added to increase the adhesion between the substrate and the thin deposition layer by urethane bonds formed when this isocyanate compound reacts with polyesterpolyol or acrylpolyol. The isocyanate compound functions primarily as a crosslinking agent or hardener.

As this isocyanate compound, it is possible to use monomers such as tolylenediisocyanate (TDI) and diphenylmethanediisocyanate (MDI) as aromatic compounds, xylenediisocyanate (XDI), hexalenediisocyanate (HMDI) and isophoronediisocyanate (IPDI) as aliphatic compounds, and polymers and derivatives of these monomers. These isocyanate compounds are used singly or as a mixture.

The blending ratio of polyesterpolyol or acrylpolyol to the isocyanate compound is not particularly restricted. However, if the amount of isocyanate compound is too small, poor hardening sometimes occurs; if the amount of isocyanate compound is too large, blocking or the like takes place, resulting in processing problems. Therefore, the blending ratio of polyesterpolyol or acrylpolyol to the isocyanate compound is preferably such that an isocyanate group derived from the isocyanate compound is 50 times a hydroxyl group derived from polyesterpolyol or acrylpolyol or less. It is particularly preferable that equal amounts of an isocyanate group and a hydroxyl group be blended. The mixing method is not particularly limited, so any known method can be used.

As a silane coupling agent used in the present invention, any silane coupling agent containing an arbitrary organic functional group can be used. For example, it is possible to use one or two types of materials selected from silane coupling agents such as ethyltrimethoxysilane, vinyltrimethoxysilane, γ-chloropropylmethyldimethoxysilane, γ-chloropropyltrimethoxysilane, glycidoxypropyltrimethoxysilane, γ-methacryloxypropyltrimethoxysilane, and γ-methacryloxypropylmethyldimethoxysilane, and hydrolyzed products of these silane coupling agents.

Of these silane coupling agents, a silane coupling agent having a functional group which reacts with at least one of a hydroxyl group of acrylpolyol, a hydroxyl group of polyesterpolyol, and an isocyanate group of an isocyanate compound is particularly preferable.

Examples of this silane coupling agent are those containing an isocyanate group, such as γ-isocyanatepropyltriethoxysilane and γ-isocyanatepropyltrimethoxysilane, those containing an amino group, such as γ-aminopropyltriethoxysilane, γ-aminopropyltrimethoxysilane, N-β-(aminoethyl)-γ-aminopropyltriethoxysilane, and γ-phenylaminopropyltrimethoxysilane, and those containing an epoxy group, such as γ-glycidoxypropyltrimethoxysilane and β-(3,4-epoxycyclohexyl)ethyltrimethoxysilane. These silane coupling agents can be used singly or in the form of a mixture of two types thereof. An organic functional group present at one end of any of these silane coupling agents interacts in a composite material consisting of polyesterpolyol or acrylpolyol and an isocyanate compound. Alternatively, a covalent bond is formed using a silane coupling agent containing a functional group which reacts with at least one of a hydroxyl group of polyesterpolyol, a hydroxyl group of acrylpolyol, and an isocyanate group of an isocyanate compound. In this manner, a stronger primer layer can be formed. A silanol group produced by hydrolysis of an alkoxy group or the like at the other end strongly interacts with a metal or a highly active hydroxyl group on the surface of an inorganic oxide, thereby achieving high adhesion to the thin deposition layer. Consequently, target physical properties can be obtained. Accordingly, a material obtained by hydrolyzing the silane coupling agent and a metal alkoxide can be used. Also, a chloro group or an acetoxy group can be used instead of an alkoxy group of the silane coupling agent. Any material by which this alkoxy group, chloro group, or acetoxy group hydrolyzes to form a silanol group can be used in this composite material.

The blending ratio of polyesterpolyol or acrylpolyol to the silane coupling agent is preferably 1/1 to 100/1, and more preferably, 2/1 to 50/1, as a weight ratio.

Dissolving and diluting solvents are not particularly limited provided that dissolution and dilution are possible. Examples are esters such as ethyl acetate and butyl acetate, alcohols such as methanol, ethanol, and isopropyl alcohol, ketones such as methylethylketone, and aromatic hydrocarbons such as toluene and xylene. These solvents can be used singly or arbitrarily blended. However, an aqueous solution of, e.g., hydrochloric acid or acetic acid is sometimes used to hydrolyze the silane coupling agent. Therefore, it is more preferable to use, as a co-solvent, a solvent in which isopropyl alcohol or the like and ethyl acetate as a polar solvent are arbitrarily mixed.

A reaction catalyst can be added to promote the reaction when the silane coupling agent is blended. As this catalyst to be added, tin compounds such as tin chloride ($SnCl_2$, $SnCl_4$), tin oxychloride ($SnOHCl$, $Sn(OH)_2Cl_2$), and tin alkoxide are preferred in respect of reactivity and polymerization stability. These catalysts can be added directly during blending or after being dissolved in a solvent such as methanol. Assuming that the molar ratio of this catalyst is 1, the molar ratio of the silane coupling agent is preferably 10 to 10,000, and more preferably, 100 to 2,000.

A primer solution for forming the primer layer is prepared by making a composite solution by mixing polyesterpolyol or acrylpolyol, the isocyanate compound, and the silane coupling agent at a given blending ratio, and coating a substrate with this composite solution. The composition solution is made as follows. That is, the silane coupling agent and polyesterpolyol or acrylpolyol can be mixed, and a solvent and diluting agent can be added to dilute the mixture to an arbitrary concentration. After that, the isocyanate compound can be mixed to make a composite solution. Alternatively, the silane coupling agent can be mixed in a solvent beforehand and polyesterpolyol or acrylpolyol can be mixed after that. A solvent and diluting agent can be added to dilute the mixture to a given concentration. After that, the isocyanate compound can be added to make a composite solution.

Various additives can also be added to this primer solution if necessary. Examples are tertiary amine, an imidazole derivative, a metal chloride of carboxylic acid, hardening accelerators such as quaternary ammonium salt and quaternary phosphonium salt, oxidation inhibitors such as phenol-based, sulfur-based, and phosphite-based oxidation inhibitors, a leveling agent, a flow modifier, a catalyst, a crosslinking accelerator, and a filler.

The dried thickness of the primer layer is preferably 10 to 2,000 nm. If the thickness is less than 10 nm, a uniform coating film is difficult to obtain, and this may lower the adhesion. If the thickness exceeds 2,000 nm, the coating film cannot maintain its flexibility and often cracks owing to external factors. The thickness of the primer layer is particularly preferably 50 to 500 nm.

As a method of forming the primer layer, it is possible to use known printing methods such as offset printing, gravure printing, and silk screen printing, and known coating methods such as roll coating, knife edge coating, and gravure coating. The drying conditions can be generally used conditions.

In the present invention, a gas-barrier intermediate layer can also be formed on the second thin deposition layer.

Figure 6:
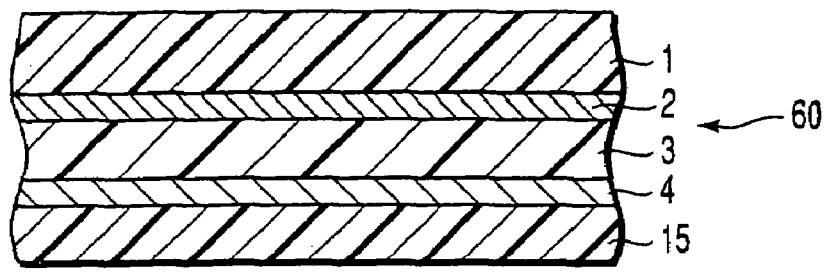
FIG. 6 is a sectional view showing the sixth example of the structure of the laminated material of the present invention.

FIG. 6 is a sectional view showing the sixth example of the structure of the laminated material according to the present invention.

As shown in FIG. 6, this laminated material 60 has the same structure as in FIG. 1 except that a gas-barrier resin layer 15 is additionally formed on a second thin deposition layer 4.

When the gas-barrier resin layer 15 is additionally formed as shown in FIG. 6, the gas barrier properties of the laminated material further improve, and the post-processing resistance also further improves.

This gas-barrier resin layer is similar to the above-mentioned, gas-barrier intermediate layer and can be formed by a method similar to the formation method of this gas-barrier intermediate layer.

The gas-barrier resin layer and the gas-barrier intermediate layer can be made of the same material or different materials.

In the present invention, a printing layer can also be formed on the second deposition layer or on the gas-barrier resin layer.

Figure 7:
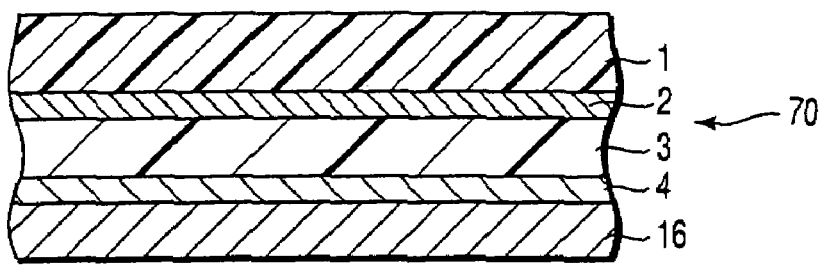
FIG. 7 is a sectional view showing the seventh example of the structure of the laminated material of the present invention.

FIG. 7 is a sectional view showing the seventh example of the structure of the laminated material according to the present invention.

As shown in FIG. 7, this laminated material 70 has the same structure as in FIG. 1 except that a printing layer 16 is formed on a second thin vapor deposition layer 4.

This printing layer 16 is formed to practically use the laminated material as a packaging bag. With this printing layer 16, images such as characters and patterns can be formed as needed.

The printing layer is made of ink formed by adding additives to a conventionally used ink binder resin. Examples of the ink binder resin are urethane-based, acryl-based, nitrocellulose-based, and rubber-based resins. Examples of the additives are various pigments, extender pigments, plasticizers, drying agents, and stabilizers.

As a method of forming the printing layer, it is possible to use known printing methods such as offset printing, gravure printing, and silk screen printing, and known coating methods such as roll coating, knife edge coating, and gravure coating. The dried film thickness of the printing layer is preferably 100 to 2,000 nm as a solid component.

Furthermore, in the present invention, a heat-sealing layer can be formed, via any intervening film, on the second thin deposition layer, gas-barrier resin layer, or printing layer.

Figure 8:
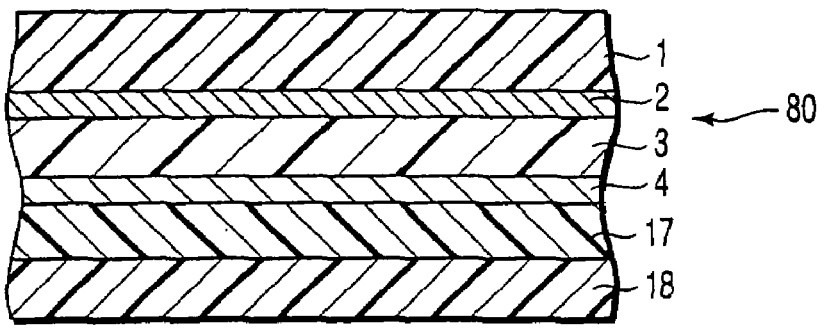
FIG. 8 is a sectional view showing the eighth example of the structure of the laminated material of the present invention.

FIG. 8 is a sectional view showing the eighth example of the structure of the laminated material according to the present invention.

As shown in FIG. 8, this laminated material 80 has the same structure as in FIG. 1 except that a heat-sealing layer 18 is formed on a second thin deposition layer 4 via an intervening film 17.

The intermediate film 17 is formed below the heat-sealing layer 18. In accordance with the structure of the laminated material, this intervening film 17 is formed between the heat-sealing layer and the gas-barrier resin layer or the printing layer other than the second thin deposition layer 4. The intervening film 17 can increase the breaking strength and piercing strength of a packaging bag.

In respect of the mechanical strength and thermal stability, this intervening film is preferably one member selected from a biaxially oriented nylon film, biaxially oriented polyethyleneterephthalate film, and biaxially oriented polypropylene film. The thickness is determined in accordance with the material and the required quality. However, the thickness is preferably 10 to 30 µm in practice. The film can be laminated by any known method such as a dry laminating method by which the film is bonded using an adhesive such as a two-part hardening type urethane-based resin.

The heat-sealing layer 18 is formed as an adhesive layer when the laminated material is molded into a packaging bag.

Examples of the material of this heat-sealing layer are resins such as polyethylene, polypropylene, an ethylene-vinyl acetate copolymer, an ethylene-methacrylic acid copolymer, an ethylene-methacrylic ester copolymer, an ethylene-acrylic acid copolymer, an ethylene-acrylic ester copolymer, and metal crosslinked products of these materials. Although the thickness of the heat-sealing layer can be determined in accordance with the purpose, it is preferably 15 to 200 µm in practice. An example of the method of forming the heat-sealing layer is dry lamination by which a film made of the aforementioned resin is bonded using an adhesive such as a two-part hardening type urethane resin. However, the formation method is not limited to this method, so the heat-sealing layer can be laminated by some other known method.

Additionally, in the present invention, a third thin deposition layer different from the second thin deposition layer can be laminated on this second thin deposition layer.

Figure 9:
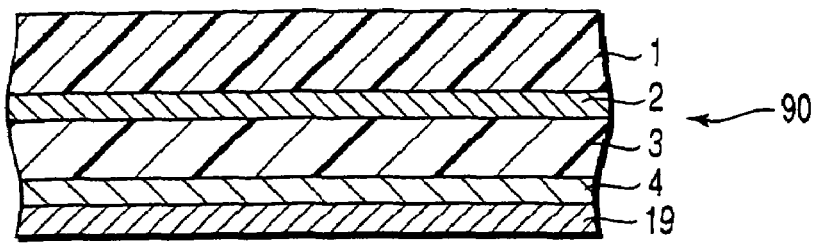
FIG. 9 is a sectional view showing the ninth example of the structure of the laminated material of the present invention.

FIG. 9 is a sectional view showing the ninth embodiment of the structure of the laminated material according to the present invention.

As shown in FIG. 9, a laminated material 90 according to the ninth example has the same structure as in FIG. 1 except that a third thin deposition layer 19 different from a second thin deposition layer 4 is formed on this second thin deposition layer 4.

As this third thin deposition layer 19, a layer similar to the first and second thin deposition layers can be used.

Good gas barrier properties can be obtained by the laminated material 90 shown in FIG. 9 in which the third thin deposition layer 19 different from the second thin deposition layer 4 is thus formed on it.

For example, it is possible to use an inorganic oxide as the first and second thin deposition layers 2 and 4, and a metal such as aluminum as the third thin deposition layer 19. When a metal is used as the thin deposition layer, an antistat effect resulting from the conductivity of the metal can be expected. When aluminum is used as this metal, electromagnetic wave shielding properties can be obtained. Also, the oxygen permeability and water vapor permeability further improve when at least one of aluminum oxide, silicon oxide, and magnesium oxide is used as the inorganic oxide and aluminum is used as the metal. Furthermore, translucency is obtained by setting the thickness of aluminum to, e.g., 5 to 30 nm.

The first to ninth embodiments described above exhibit the structure basically having two thin deposition layers and one gas-barrier intermediate layer formed between these two thin deposition layers, and the applications of this structure. However, the present invention is not limited to this structure. That is, the present invention also includes a multilayered structure having three or more thin deposition layers and gas-barrier intermediate layers each formed between these thin deposition layers.

The thin deposition layers can be the same or different.

The gas-barrier intermediate layers can also be the same or different.

Figure 10:
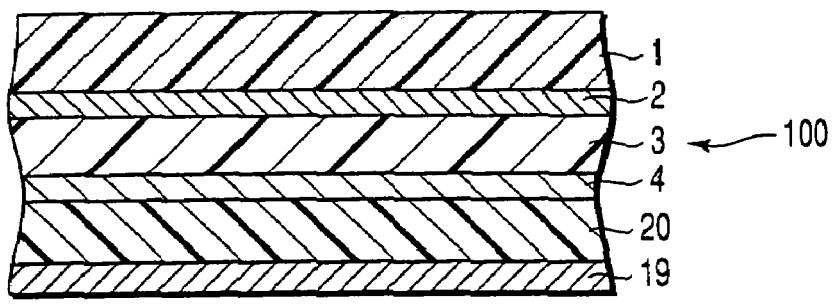
FIG. 10 is a sectional view showing the 10th example of the structure of the laminated material of the present invention.

FIG. 10 is a sectional view showing the 10th example of the structure of the laminated material according to the present invention.

As shown in FIG. 10, this laminated material 100 has a multilayered structure in which gas-barrier intermediate layers 3 and 20 are formed between first to third thin deposition layers 2, 4, and 19. This multilayered structure is the same as in FIG. 1 except that the third thin deposition layer 19 is formed on the second thin deposition layer 4 via the gas-barrier intermediate layer 20.

As the third thin deposition layer 19, a layer similar to the first and second thin deposition layers can be used.

Also, in the structure shown in FIG. 9, a gas-barrier intermediate layer 20 can be formed between the second thin deposition layer 19 which is, e.g., an inorganic oxide layer and the third thin deposition layer which is a metal layer such as an aluminum layer. In this manner, an example of the laminated material having this multilayered structure is obtained.

Note that the 10th embodiment can be combined, where necessary, with the characterized portions of the second to ninth embodiments described above.

The present invention will be described in more detail below by way of its examples.

EXAMPLES

Example 1

As a plastic substrate, a 12-μm thick biaxially oriented polyethyleneterephthalate (PET) film was prepared. This PET film was placed in an electron beam heating type vacuum deposition apparatus. Metal aluminum was evaporated, and oxygen gas was introduced to the evaporated aluminum to deposit a 15-nm thick aluminum oxide layer on one surface of the PET film, thereby obtaining a first thin deposition layer.

Subsequently, an intermediate layer coating agent 1 below was prepared.

Preparation of Intermediate Layer Coating Agent 1

As a first solution, 89.6 g of hydrochloric acid (0.1 N) were added to 10.4 g of tetraethoxysilane, and the mixture was hydrolyzed under stirring for 30 min to prepare a hydrolyzed solution containing 3 wt % of a solid component equal to the amount of $SiO_2$.

As a second solution, 97 wt % of a water-isopropyl alcohol solution, in which water and isopropyl alcohol were mixed at a weight ratio of 90 to 10, and 3 wt % of polyvinyl alcohol were mixed.

The first and second solutions were mixed at a weight ratio of 60 to 40 to obtain the intermediate layer coating solution 1.

A layer of the obtained intermediate layer coating solution 1 was formed by gravure coating and dried at 120° C. for 1 min to form a 500-nm thick gas-barrier intermediate layer.

After that, the substrate on which the first thin deposition layer and the gas-barrier intermediate layer were formed was placed in the electron beam heating type vacuum deposition apparatus. Metal aluminum was evaporated, and oxygen gas was introduced to the evaporated aluminum to deposit a 15-nm thick aluminum oxide layer as a second thin deposition layer, thereby obtaining a transparent laminated material. The structure of the obtained laminated material was the same as in FIG. 2.

The obtained laminated material was tested for gas barrier properties, transparency, and environmental compatibility.

Gas Barrier Properties Test

As an index of the gas barrier properties, the water vapor permeability ($g/m^2 \cdot day$) was measured. This water vapor permeability was measured using the Mokon method, and the measurement conditions were 40° C.–90% RH.

Transparency Test

To check the transparency, whether the contents could be visually seen was observed. ○ indicates that the contents could be seen, and X indicates that the contents could not be seen.

Environmental Compatibility Test

The environmental compatibility was checked by performing an incineration test and checking whether chlorine gas was produced or not and any residue remained. ○ indicates high compatibility, and X indicates unsatisfactory compatibility.

In addition, the laminated material was totally evaluated for the transparency, the water vapor permeability indicating the gas barrier properties, and the environmental compatibility.

○ indicates that all of the transparency, gas barrier properties, and environmental compatibility were satisfied. X indicates that not all of these factors were satisfied.

The results are shown in Table 1 to be presented later.

Table 1 also shows the thickness ratio of the first thin deposition layer, gas-barrier intermediate layer, and second thin deposition layer.

Example 2

A transparent laminated material was obtained following the same procedures as in Example 1 except that instead of aluminum oxide, a silicon oxide layer having a thickness of about 30 nm was vacuum-deposited as a second thin deposition layer by a resistance heating type vacuum deposition method.

The obtained laminated material was tested in the same manner as in Example 1. The results are shown in Table 1.

Example 3

A transparent laminated material was obtained following the same procedures as in Example 1 except that instead of aluminum oxide, a silicon oxide layer having a thickness of about 20 nm was deposited as a first thin deposition layer by a resistance heating type vacuum deposition method.

The obtained laminated material was tested in the same manner as in Example 1. The results are shown in Table 1.

Example 4

A transparent laminated material was obtained following the same procedures as in Example 1 except that a magnesium oxide layer having a thickness of about 15 nm was deposited as a first thin deposition layer by an electron beam heating type vacuum deposition method.

The obtained laminated material was tested in the same manner as in Example 1. The results are shown in Table 1.

Comparative Example 1

A transparent laminated material was obtained following the same procedures as in Example 1 except that no second thin deposition layer was formed.

The obtained laminated material was tested in the same manner as in Example 1. The results are shown in Table 1.

Comparative Example 2

A transparent laminated material was obtained following the same procedures as in Example 1 except that a gas-barrier intermediate layer was formed after a second thin deposition layer was deposited on a first thin deposition layer.

The obtained laminated material was tested in the same manner as in Example 1. The results are shown in Table 1.

water vapor permeability was high, so gas barrier properties equivalent to those of metal foils were not obtained.

Example 5

As a plastic substrate, a 12-μm thick biaxially oriented PET film was prepared.

Subsequently, a primer layer coating solution was prepared as follows.

Formation of Primer Layer Coating Solution

Ethyl acetate was prepared as a diluting solvent. 10 parts by weight of acrylpolyol were mixed in 1 part by weight of γ-isocyanatepropyltrimethylsilane, and the mixture was stirred.

Subsequently, a 7:3 mixture of XDI and IPDI as an isocyanate compound was added such that the amount of an isocyanate group of this isocyanate compound was equal to the amount of a hydroxyl group of the acrylpolyol, thereby obtaining a solution mixture.

The obtained solution mixture was diluted with ethyl acetate so that the solid component was 2 wt %, thereby preparing a primer layer coating solution.

One surface of the PET film was coated with this primer layer coating solution by gravure coating, and the solution was dried to form a 0.1-μm thick primer layer.

On the substrate on which the primer layer was thus formed, 15-nm thick aluminum oxide was deposited in the same manner as in Example 1, forming a first thin deposition layer.

After that, a layer of the same intermediate layer coating agent 1 as used in Example 1 was formed by gravure coating and dried at 120° C. for 1 min, thereby forming a 400-nm thick gas-barrier intermediate layer.

On this gas-barrier intermediate layer, a second thin deposition layer was formed in the same manner as in Example 1.

TABLE 1

| | Water vapor permeability (g/cm² · day) | Transparency | Environmental compatibility | Thickness ratio Thickness (nm) | Ratio | Total evaluation |
|---|---|---|---|---|---|---|
| Example 1 | 0.04 | ○ | ○ | 15/500/15 | 0.03/1/0.03 | ○ |
| Example 2 | 0.03 | ○ | ○ | 15/500/30 | 0.03/1/0.06 | ○ |
| Example 3 | 0.08 | ○ | ○ | 20/500/15 | 0.04/1/0.03 | ○ |
| Example 4 | 0.07 | ○ | ○ | 15/500/30 | 0.03/1/0.06 | ○ |
| Comparative Example 1 | 1.3 | ○ | ○ | 15/500/- | — | X |
| Comparative Example 2 | 0.4 | ○ | ○ | 15/15/500 | — | X |

As is apparent from Table 1, the laminated materials of Examples 1 to 4 satisfied all of the transparency with which the contents could be visually seen, the high-level gas barrier properties equivalent to those of metal foils, with which gases and the like having influence on the contents could be stopped, and the environmental compatibility.

In contrast, when the structure in which only one deposition layer and one gas-barrier layer were formed on the substrate was used as in Comparative Example 1, the transparency was high but the water vapor permeability had a very high value, indicating deterioration of the gas barrier properties. Also, when the structure in which the two thin deposition layers were laminated on the substrate without forming any gas-barrier intermediate layer was used, the On this second thin deposition layer, a 500-nm thick gas-barrier resin layer was formed in the same manner as for the gas-barrier intermediate layer.

A 15-μm thick biaxially oriented nylon film as an intervening film was laminated on the obtained gas-barrier resin layer by dry lamination by using a two-part hardening type urethane-based adhesive. In addition, a 70-μm thick unstretched polypropylene film as a heat-sealing layer was laminated by dry lamination by using the two-part hardening type urethane-based adhesive, thereby manufacturing a packaging material.

Figure 11:
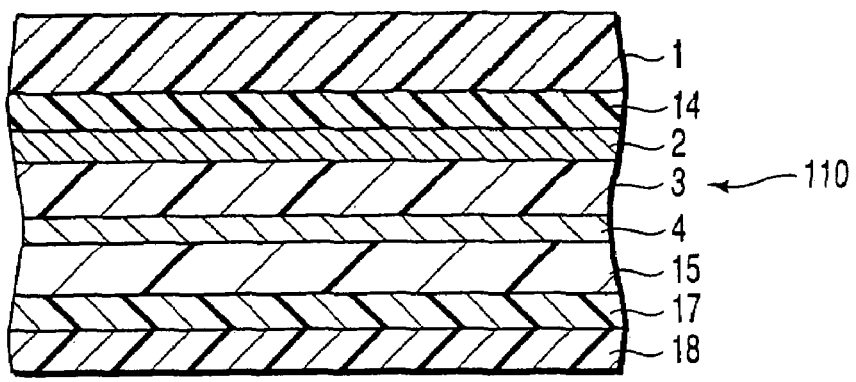
FIG. 11 is a sectional view showing the 11th example of the structure of the laminated material of the present invention.

FIG. 11 is a sectional view showing the structure of this packaging material.

As shown in FIG. 11, this packaging material 110 has a structure in which a primer layer 14, a first thin deposition layer 2, a gas-barrier intermediate layer 3, a second thin deposition layer 4, a gas-barrier resin layer 15, an intervening film 17, and a heat-sealing layer 18 were laminated in this order on a substrate 1.

The following retort tests were conducted using this packaging material.

A pouch having sealing portions on its four sides was made by using the obtained packaging material, and filled with 150 g of water as a content.

The obtained laminated material was tested in the same manner as in Example 5. The results are shown in Table 2.

Example 7

A transparent laminated material was obtained following the same procedures as in Example 5 except that no primer layer was formed.

The obtained laminated material was tested in the same manner as in Example 5. The results are shown in Table 2.

TABLE 2

|  | Oxygen permeability ($cm^3/m^2 \cdot day \cdot atm$) | | Lamination strength (N/15 mm) | | Environmental compatibility | Total evaluation |
| --- | --- | --- | --- | --- | --- | --- |
|  | Before retort sterilization | After retort sterilization | Before retort sterilization | After retort sterilization | | |
| Example 5 | 0.01 | 0.05 | 420 | 410 | ○ | ○ |
| Example 6 | 0.03 | 0.10 | 400 | 390 | ○ | ○ |
| Comparative Example 3 | 0.20 | 1.78 | 420 | 400 | ○ | X |
| Example 7 | 0.02 | 0.10 | 390 | 150 | ○ | Δ |

Retort Tests

Retort sterilization was performed at 121° C. for 30 min.
Test for gas barrier properties before and after retort sterilization The oxygen permeability ($cm^3/m^2 \cdot day \cdot atm$) of the packaging material before retort sterilization and that of the packaging material after retort sterilization were measured under measurement conditions of 30° C.–70% RH.

Test for Lamination Strength before and After Retort Sterilization

The lamination strength (N/15 mm) of the packaging material before retort sterilization and that of the packaging material after retort sterilization were measured at a peeling rate of 300 mm/min by the ISO 4578 (JIS K 6854) test.

The results are shown in Table 2 to be presented later.

The transparency and the environmental compatibility were tested following the same procedures as in Example 1.

Total evaluation was performed on the basis of the obtained results. The results are also shown in Table 2. ○ indicates that all of the transparency, the gas barrier properties before and after retort sterilization, and the environmental compatibility were satisfied. X indicates that not all of these factors were satisfied.

Example 6

A transparent laminated material was obtained following the same procedures as in Example 5 except that instead of the second thin deposition layer, silicon oxide having a thickness of about 25 nm was deposited by a resistance heating type vacuum deposition method.

The obtained laminated material was tested in the same manner as in Example 5. The results are shown in Table 2.

Comparative Example 3

A transparent laminated material was obtained following the same procedures as in Example 5 except that no gas-barrier intermediate layer was formed.

As shown in Table 2, even when retort sterilization was performed, the laminated materials of Examples 5 and 6 satisfied all of the transparency, the high-level gas barrier properties equivalent to those of metal foils, with which gases and the like having influence on the contents were stopped, the various sterilization resistances, and the environmental compatibility.

In contrast, when the structure in which the two thin deposition layers were laminated on the substrate without forming any gas-barrier intermediate layer was used as in Comparative Example 3, no such high-level gas barrier properties as equivalent to those of metal foils were obtained. When no primer layer was formed as in Example 7, the lamination strength after retort sterilization decreased.

Example 8

A laminated material was obtained following the same procedures as in Example 1 except that the thickness of a gas-barrier intermediate layer was 400 nm.

The water vapor permeability of the obtained laminated material was measured.

○ indicates a water vapor permeability of 0.2 or less, and X indicates other values.

The obtained results are shown in Table 3 to be presented later. Table 3 also shows the thickness ratio of the first thin deposition layer, gas-barrier intermediate layer, and second thin film deposition layer.

Example 9

A laminated material was obtained following the same procedures as in Example 8 except that silicon oxide having a thickness of about 35 nm was deposited as a second thin deposition layer by using a resistance heating type vacuum deposition apparatus.

The obtained laminated material was tested and evaluated in the same manner as in Example 8. The results are shown in Table 3.

Example 10

A laminated material was obtained following the same procedures as in Example 8 except that metal aluminum was evaporated to deposit 40-nm thick aluminum as a second thin deposition layer by using an electron beam heating type vacuum deposition apparatus.

The obtained laminated material was tested and evaluated in the same manner as in Example 8. The results are shown in Table 3.

The surface resistance value of this laminated material was 45 $\Omega/cm^2$.

Example 11

A laminated material was obtained following the same procedures as in Example 8 except that a primer layer similar to that in Example 5 was formed.

The obtained laminated material was tested and evaluated in the same manner as in Example 8. The results are shown in Table 3.

Also, the obtained laminated material was used to make a packaging material and conduct retort tests following the same procedures as in Example 5. The results are shown in Table 4 to be presented later.

Example 12

A laminated material was obtained following the same procedures as in Example 11 except that a 15-μm thick biaxially oriented nylon film (ONY) was used as a substrate.

The obtained laminated material was tested and evaluated in the same manner as in Example 8. The results are shown in Table 3.

In addition, on the second thin deposition layer of this laminated material, a 60-μm thick low-density polyethylene film was laminated as a heat-sealing layer by dry lamination by using a two-part hardening type urethane-based adhesive, thereby making a packaging material.

The obtained packaging material was used to conduct the following boiling test.

Boiling Test

A pouch having sealing portions on its four sides was made by using the obtained packaging material, and filled with 150 g of water as a content.

After that, boiling sterilization was performed at 90° C. for 30 min.

The values of oxygen permeability ($cm^3/m^2 \cdot day \cdot atm$) before and after boiling sterilization were measured under measurement conditions of 30° C.–70% RH. Also, the lamination strength of the pouch was measured in the same manner as in Example 5. Total evaluation was performed by taking account of these oxygen permeability and lamination strength. The results are shown in Table 5 to be presented later.

Example 13

A laminated material was obtained following the same procedures as in Example 11 except that a 0.5-μm thick gas-barrier resin layer was formed on a second thin deposition layer by using the same coating agent as a gas-barrier intermediate layer.

The obtained laminated material was tested and evaluated in the same manner as in Example 8. The results are shown in Table 3.

Also, the obtained laminated material was used to make a packaging material and conduct retort tests following the same procedures as in Example 5. The results are shown in Table 4.

Example 14

A laminated material was obtained following the same procedures as in Example 10 except that 10-nm thick metal aluminum was deposited as a second thin deposition layer.

The obtained laminated material was tested and evaluated in the same manner as in Example 8. The results are shown in Table 3.

The surface resistance value of this laminated material was 50 $\Omega/cm^2$. The light transmittance at a wavelength of 500 nm was 40%.

Comparative Example 4

A laminated material was obtained following the same procedures as in Example 8 except that no second thin deposition layer was formed.

The obtained laminated material was tested and evaluated in the same manner as in Example 8. The results are shown in Table 3.

Comparative Example 5

A laminated material was obtained following the same procedures as in Example 11 except that no second thin deposition layer was formed.

The obtained laminated material was tested and evaluated in the same manner as in Example 8. The results are shown in Table 3.

Also, the obtained laminated material was used to make a packaging material and conduct retort tests following the same procedures as in Example 5. The results are shown in Table 4.

Comparative Example 6

A laminated material was obtained following the same procedures as in Example 12 except that no second thin deposition layer was formed.

The obtained laminated material was tested and evaluated in the same manner as in Example 8. The results are shown in Table 3.

Also, a boiling test was conducted in the same manner as in Example 12. The results are shown in Table 5.

Example 15

A laminated material was obtained following the same procedures as in Example 11 except that the thickness of a gas-barrier intermediate layer was 50 nm.

The obtained laminated material was tested and evaluated in the same manner as in Example 8. The results are shown in Table 3.

Comparative Example 7

A laminated material was obtained following the same procedures as in Example 8 except that the thickness of each of first and second thin deposition layers was 20 nm, and that the second thin deposition layer was deposited directly on the first thin deposition layer without forming any gas-barrier intermediate layer.

The obtained laminated material was tested and evaluated in the same manner as in Example 8. The results are shown in Table 3.

Comparative Example 8

A laminated material was obtained following the same procedures as in Comparative Example 7 except that a silicon oxide layer having a thickness of about 40 nm was deposited as a second thin deposition layer by using a resistance heating type vacuum deposition apparatus.

The obtained laminated material was tested and evaluated in the same manner as in Example 8. The results are shown in Table 3.

Comparative Example 9

A laminated material was obtained following the same procedures as in Comparative Example 7 except that a gas-barrier resin layer was formed on a second thin deposition layer in the same manner as for the gas-barrier intermediate layer in Example 8.

The obtained laminated material was tested and evaluated in the same manner as in Example 8. The results are shown in Table 3.

Example 16

A laminated material was obtained by depositing 10-nm thick metal aluminum in the same manner as in Example 14 on a second thin deposition layer of a laminated material obtained following the same procedures as in Example 8.

The obtained laminated material was tested and evaluated in the same manner as in Example 8. The results are shown in Table 3.

The surface resistance value of this laminated material was 50 $\Omega/cm^2$. The light transmittance at a wavelength of 500 nm was 40%.

TABLE 3

| | Water vapor permeability ($g/m^2 \cdot day$) | Thickness ratio | | Evaluation result |
|---|---|---|---|---|
| | | Thickness (nm) | (Ratio) | |
| Example 8 | 0.04 | 15/400/15 | 0.0375/1/0.0375 | ○ |
| Example 9 | 0.03 | 15/400/35 | 0.0375/1/0.0875 | ○ |
| Example 10 | 0.04 | 15/400/40 | 0.0375/1/0.1 | ○ |
| Example 11 | 0.07 | 15/400/15 | 0.0375/1/0.0375 | ○ |
| Example 12 | 0.12 | 15/400/15 | 0.0375/1/0.0375 | ○ |
| Example 13 | 0.01 | 15/400/15 | 0.0375/1/0.0375 | ○ |
| Example 14 | 0.15 | 15/400/10 | 0.0375/1/0.025 | ○ |
| Comparative Example 4 | 0.95 | 15/400/0 | 0.0375/1/0 | X |
| Comparative Example 5 | 2.12 | 15/400/0 | 0.0375/1/0 | X |
| Comparative Example 6 | 4.05 | 15/400/0 | 0.0375/1/0 | X |
| Example 15 | 0.47 | 15/50/15 | 0.3/1/0.3 | △ |
| Comparative Example 7 | 2.5 | — | — | X |
| Comparative Example 8 | 1.7 | — | — | X |
| Comparative Example 9 | 1.1 | — | — | X |
| Example 16 | 0.03 | 15/400/15 | 0.0375/1/0.0375 | ○ |

As shown in Table 3, high-level gas barrier properties equivalent to those of metal foils were obtained in Examples 8 to 14 and 16. In Example 15, the ratio of the gas-barrier intermediate layer to the first and second thin deposition layers was large, so the oxygen permeability was slightly higher than those of Examples 8 to 13.

In contrast, when only one thin deposition layer was formed as in Comparative Examples 4 to 6, no satisfactory gas barrier properties were obtained. Furthermore, the oxygen permeability did not decrease to result in unsatisfactory gas barrier properties when two thin deposition layers were formed on a substrate without using any intermediate layer as in Comparative Examples 7 and 8, or when a gas-barrier resin layer was formed on these two thin deposition layers as in Comparative Example 10.

TABLE 4

| | Oxygen permeability ($cm^3/m^2 \cdot day \cdot atm$) | | Lamination strength (N/15 mm) | | Total evaluation |
|---|---|---|---|---|---|
| | Before retort sterilization | After retort sterilization | Before retort sterilization | After retort sterilization | |
| Example 11 | 0.13 | 0.56 | 420 | 410 | ○ |
| Example 13 | 0.09 | 0.12 | 400 | 390 | ○ |
| Comparative Example 5 | 0.34 | 1.78 | 420 | 400 | X |

Table 4 above shows that Examples 11 and 13 had high-level gas barrier properties and lamination strength equivalent to those of metal foils even when retort sterilization was performed.

However, when a single thin deposition layer was formed without forming any second thin deposition layer as in Comparative Example 5, the gas barrier properties were unsatisfactory.

TABLE 5

| | Oxygen permeability ($cm^3/m^2 \cdot day \cdot atm$) | | Lamination strength (N/15 mm) | | Total evaluation |
|---|---|---|---|---|---|
| | Before retort sterilization | After retort sterilization | Before retort sterilization | After retort sterilization | |
| Example 12 | 0.19 | 0.75 | 1400 | 1100 | ○ |
| Comparative Example 6 | 0.37 | 2.98 | 1500 | 1200 | X |

Example 12 had satisfactory gas barrier properties and lamination strength both before and after the boiling test. However, when a single thin deposition layer was formed without forming any second thin deposition layer as in Comparative Example 6, particularly the oxygen permeability rose to deteriorate the gas barrier properties.

INDUSTRIAL APPLICABILITY

A laminated material of the present invention realizes superior gas barrier properties equivalent to those of metal foils without using any metal foils, and maintains the gas barrier properties and lamination strength even after boiling sterilization or retort sterilization. Therefore, this laminated material can be widely used in the fields of packaging and electronic apparatus members.

The invention claimed is:

1. A laminated material, comprising:
   a substrate made of a plastic material;
   a first thin deposition layer made of inorganic material, formed on said substrate;

a gas-barrier intermediate layer formed in contact with said first thin deposition layer by coating with a coating agent containing at least a water-soluble polymer; and a second thin deposition layer made of inorganic material, deposited directly on said intermediate layer, wherein said intermediate layer is obtained by coating with a coating agent containing primarily a water-soluble polymer and one of an aqueous solution or a water-alcohol solution mixture each containing at least one of i) not less than one type of a metal alkoxide and a hydrolyzed product thereof, or ii) tin chloride, and wherein said intermediate layer has a thickness of 200 to 600 nm, and each of the first thin deposition layer and the second thin deposition layer has a thickness of 5 to 40 nm.

2. A laminated material according to claim 1, wherein said metal alkoxide contains at least one of tetraethoxysilane or triisopropoxy aluminum.

3. A laminated material according to claim 1, wherein said water-soluble polymer is polyvinyl alcohol.

4. A laminated material according to claim 1, further comprising a primer layer between said substrate and said first thin deposition layer.

5. A laminated material according to claim 4, wherein said primer layer contains a composite material containing one of acrylpolyol and polyesterpolyol, an isocyanate compound, or a silane coupling agent.

6. A laminated material according to claim 5, wherein said silane coupling agent has an organic functional group which reacts with at least one of a hydroxyl group of acrylpolyol, a hydroxyl group of polyesterpolyol, or an isocyanate group of an isocyanate compound.

7. A laminated material according to claim 6, wherein said organic functional group is at least one of an isocyanate group, epoxy group, or amino group.

8. A laminated material according to claim 5, wherein a reaction catalyst is added to said composite material.

9. A laminated material according to claim 8, wherein said reaction catalyst is a tin compound.

10. A laminated material according to claim 9, wherein said tin compound is one member selected from the group consisting of tin chloride, tin oxychloride, and tin alkoxide.

11. A laminated material according to claim 1, further comprising a gas-barrier coating layer formed by coating on said second thin deposition layer with a coating agent containing at least a water-soluble polymer.

12. A laminated material according to claim 11, wherein said gas-barrier coating layer is obtained by coating with a coating agent containing primarily a water-soluble polymer and one of an aqueous solution and a water-alcohol solution mixture each containing at least one of i) not less than one type of a metal alkoxide and a hydrolyzed product thereof, and ii) tin chloride.

13. A laminated material according to claim 12, wherein said metal alkoxide contains at least one of tetraethoxysilane and triisopropoxy aluminum.

14. A laminated material according to claim 11, wherein said water-soluble polymer is polyvinyl alcohol.

15. A laminated material according to claim 11, further comprising a hot-melt resin layer on said gas-barrier coating layer.

16. A laminated material according to claim 1, wherein said first and second thin deposition layers are transparent.

17. A laminated material according to claim 1, wherein at least one of said first thin deposition layer or said second thin deposition layer has light-shielding properties.

18. A laminated material according to claim 1, further comprising a hot-melt resin layer on said second thin deposition layer.

19. A laminated material according to claim 1, further comprising a water vapor permeability of not more than 0.2 $(g/m^2 \cdot day)$, when measurement is performed at a temperature of 40° C. and a humidity of 90% by using the Mokon method.

20. A laminated material according to claim 1, wherein said first and second thin deposition layers contain at least one material selected from the group consisting of aluminum, copper, silver, yttrium tantalum oxide, aluminum oxide, silicon oxide, and magnesium oxide.

21. A laminated material according to claim 1, wherein said first thin deposition layer is made of a material different from said second thin deposition layer.

22. A laminated material according to claim 1, wherein said first thin deposition layer is made of the same material as said second thin deposition layer.

23. A laminated material according to claim 1, wherein at least one of said first thin deposition layer or said second thin deposition layer is substantially a thin metal deposition layer of a metal selected from the group consisting of aluminum, copper, and silver.

24. A laminated material according to claim 23, wherein said thin metal deposition layer has a thickness of 5 to 15 nm.

25. A laminated material according to claim 1, wherein said first and second thin deposition layers are transparent layers containing at least one material selected from the group consisting of yttrium tantalum oxide, aluminum oxide, silicon oxide, and magnesium oxide.

26. A laminated material according to claim 1, wherein said first and second thin deposition layers contain at least one material selected from the group consisting of aluminum, aluminum oxide, silicon oxide, and magnesium oxide.

27. A laminated material according to claim 1, further comprising a gas-barrier intermediate layer and a third thin deposition layer on said second thin deposition layer.

28. A laminated material according to claim 1, further comprising a third thin deposition layer on said second thin deposition layer.

29. The laminated material according to claim 1, wherein one of the first thin deposition layer or the second thin deposition layer is substantially a thin metal deposition layer, and another of the first thin deposition layer or the second thin deposition layer is substantially a thin metal oxide deposition layer.

30. The laminated material according to claim 29, wherein the thin metal deposition layer has a thickness of 5 to 15 nm.

31. A laminated material, comprising:

a plastic substrate;

a first thin inorganic deposition layer on the plastic substrate;

at least one pair of layers disposed consecutively thereon, being a water-soluble gas barrier layer on the first thin inorganic layer and a second thin inorganic deposition layer on the water-soluble gas barrier layer, wherein said water-soluble gas barrier layer layer has a thickness of 200 to 600 nm, and each of the first thin inorganic deposition layer and the second thin inorganic deposition layer has a thickness of 5 to 40 nm.

* * * * *

UNITED STATES PATENT AND TRADEMARK OFFICE
CERTIFICATE OF CORRECTION

```
PATENT NO.       : 7,288,313 B2
APPLICATION NO.  : 10/473950
DATED            : October 30, 2007
INVENTOR(S)      : Noboru Sasaki et al.
```

It is certified that error appears in the above-identified patent and that said Letters Patent is hereby corrected as shown below:

Column 22, Line 61, after "layer" delete "layer" (Second Occurrence).

Title page, item [54], Column 1 (Title), Line 1, change "LAMINATED BODY" to --LAMINATED MATERIAL--.

Column 1, Line 1, change "LAMINATED BODY" to --LAMINATED MATERIAL--.

Signed and Sealed this

Sixth Day of May, 2008

JON W. DUDAS
*Director of the United States Patent and Trademark Office*